United States Patent
Ito et al.

(10) Patent No.: US 11,515,069 B2
(45) Date of Patent: Nov. 29, 2022

(54) MULTILAYER SUBSTRATE AND ELECTRONIC DEVICE

(71) Applicant: Murata Manufacturing Co., Ltd., Nagaokakyo (JP)

(72) Inventors: Shingo Ito, Nagaokakyo (JP); Hirotaka Fujii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 994 days.

(21) Appl. No.: 16/218,524

(22) Filed: Dec. 13, 2018

(65) Prior Publication Data
US 2019/0115136 A1 Apr. 18, 2019

Related U.S. Application Data

(63) Continuation of application No. PCT/JP2017/026759, filed on Jul. 25, 2017.

(30) Foreign Application Priority Data

Aug. 5, 2016 (JP) .............................. JP2016-154366
Jun. 26, 2017 (JP) .............................. JP2017-123840

(51) Int. Cl.
*H01F 17/00* (2006.01)
*H01F 27/29* (2006.01)
(Continued)

(52) U.S. Cl.
CPC ..... *H01F 17/0013* (2013.01); *H01F 27/2804* (2013.01); *H01F 27/29* (2013.01);
(Continued)

(58) Field of Classification Search
CPC ............. H01F 17/0013; H01F 27/2804; H01F 2027/2809; H01F 17/0006; H01F 5/003;
(Continued)

(56) References Cited

U.S. PATENT DOCUMENTS 4,881,050 A * 11/1989 Swanson, Jr. ........ H03H 7/0115
361/328
2009/0315662 A1 12/2009 Hijioka et al.
2015/0294781 A1 10/2015 Yosui et al.

FOREIGN PATENT DOCUMENTS

EP 1 085 538 A1 3/2001
JP 56-091406 A 7/1981
(Continued)

OTHER PUBLICATIONS

Official Communication issued in corresponding Japanese Patent Application No. 2018-531845, dated Jun. 4, 2019.
(Continued)

*Primary Examiner* — Tszfung J Chan
(74) *Attorney, Agent, or Firm* — Keating & Bennett, LLP

(57) ABSTRACT

A multilayer substrate includes a stacked body, coil conductor patterns, and a connection conductor pattern. The stacked body includes insulating layers. A first coil conductor pattern is provided on the front surface of an insulating layer and has a wound shape including outer and inner end portions. A second coil conductor pattern is provided on the front surface of the insulating layer and includes an end portion. The connection conductor pattern is provided in the stacked body, and connects the coil conductor patterns. The outer end portion is connected to a terminal conductor on a back surface of the stacked body. The end portion of the second coil conductor pattern is connected to the terminal conductor on the back surface of the stacked body. The first coil conductor pattern extends parallel or substantially parallel to the second coil conductor pattern along an outer periphery of the second coil conductor pattern.

20 Claims, 10 Drawing Sheets

(51) Int. Cl.
*H01F 27/28* (2006.01)
*H01G 4/06* (2006.01)
*H03H 7/01* (2006.01)
*H05K 1/16* (2006.01)
*H03H 1/00* (2006.01)

(52) U.S. Cl.
CPC .............. *H01G 4/06* (2013.01); *H03H 7/0115* (2013.01); *H05K 1/165* (2013.01); *H01F 2017/0073* (2013.01); *H03H 2001/0078* (2013.01); *H03H 2001/0085* (2013.01)

(58) Field of Classification Search
CPC ................. H05K 1/165; H03H 7/0115; H03H 2001/0078; H01G 4/06
USPC .................................................. 336/200, 232

See application file for complete search history.

(56) References Cited

FOREIGN PATENT DOCUMENTS

| | | | | |
|---|---|---|---|---|
| JP | 62-182507 | U | | 11/1987 |
| JP | 2000-196391 | A | | 7/2000 |
| JP | 2001-085230 | A | | 3/2001 |
| JP | 2001-338827 | A | | 12/2001 |
| JP | 2008-066594 | A | | 3/2008 |
| JP | 2008066594 | A | * | 3/2008 |
| JP | 2011-155299 | A | | 8/2011 |
| JP | 2011155299 | A | * | 8/2011 ......... H01F 17/0006 |
| JP | 4927115 | B2 | | 5/2012 |
| WO | 2008/016089 | A1 | | 2/2008 |
| WO | 2014/129279 | A1 | | 8/2014 |
| WO | WO-2014129279 | A1 | * | 8/2014 ............... H01F 1/34 |

OTHER PUBLICATIONS

Official Communication issued in International Patent Application No. PCT/JP2017/026759, dated Oct. 24, 2017.

* cited by examiner

MULTILAYER SUBSTRATE AND ELECTRONIC DEVICE

CROSS REFERENCE TO RELATED APPLICATIONS

This application claims the benefit of priority to Japanese Patent Application No. 2016-154366 filed on Aug. 5, 2016 and Japanese Patent Application No. 2017-123840 filed on Jun. 26, 2017, and is a Continuation Application of PCT Application No. PCT/JP2017/026759 filed on Jul. 25, 2017. The entire contents of each application are hereby incorporated herein by reference.

BACKGROUND OF THE INVENTION

1. Field of the Invention

The present invention relates to a multilayer substrate including a coil and a capacitor, and an electronic device including a multilayer substrate.

2. Description of the Related Art

Japanese Unexamined Patent Application Publication No. 2000-196391 discloses a multilayer substrate including a filter composed of a parallel circuit of a coil and a capacitor. The multilayer substrate disclosed in Japanese Unexamined Patent Application Publication No. 2000-196391 is a stacked body obtained by stacking a plurality of layers. Each of the plurality of layers includes a wound coil conductor. The coil conductors of the plurality of layers are connected to each other by an interlayer connection conductor. According to this configuration, the multilayer substrate includes a spiral coil that includes a coil axis in parallel to a stacking direction in which the plurality of layers are stacked on each other.

The one end of the coil is connected to a first lateral surface conductor, and the other end of the coil is connected to a second lateral surface conductor. The first lateral surface conductor is provided on one lateral surface of two lateral surfaces that face each other in the stacked body, and the second lateral surface conductor is provided on the other lateral surface of the two lateral surfaces that face each other in the stacked body. According to this configuration, the first lateral surface conductor and the second lateral surface conductor face each other over a predetermined area across the stacked body. As a result, the multilayer substrate includes a capacitor.

However, in the multilayer substrate disclosed in Japanese Unexamined Patent Application Publication No. 2000-196391, the shape of a land conductor of an external circuit board to which the multilayer substrate is mounted is limited. Therefore, it may become difficult to mount the multilayer substrate to the external circuit board.

In addition, in the multilayer substrate disclosed in Japanese Unexamined Patent Application Publication No. 2000-196391, the first lateral surface electrode and the second lateral surface electrode, together with the coil conductor in proximity to the first lateral surface electrode and the second lateral surface electrode, may generate an unnecessary capacitance. As a result, desired filter characteristics may not be achieved.

SUMMARY OF THE INVENTION

Preferred embodiments of the present invention provide multilayer substrates that each include a coil and a capacitor, the multilayer substrates being able to be easily mounted to an external circuit board and significantly reducing or preventing generation of an unnecessary capacitance, and electronic devices including such multilayer substrates.

A multilayer substrate according to a preferred embodiment of the present invention includes a stacked body, a first coil conductor pattern, a second coil conductor pattern, a connection conductor pattern, a first terminal conductor, and a second terminal conductor. The stacked body is obtained by stacking a plurality of insulating layers. The first coil conductor pattern is provided on at least a front surface of an insulating layer among the plurality of insulating layers, the insulating layer being a surface layer of the stacked body, the front surface being a front surface of the stacked body, and has a wound shape including a first end and a second end. The second coil conductor pattern is provided on the front surface of the stacked body, and includes a third end and a fourth end. The connection conductor pattern is provided in the stacked body, and connects the first coil conductor pattern and the second coil conductor pattern. The first terminal conductor and the second terminal conductor are provided in the stacked body. The first end of the first coil conductor pattern is connected to the first terminal conductor. The fourth end of the second coil conductor pattern is connected to the second terminal conductor. The connection conductor pattern connects the second end of the first coil conductor pattern and the third end of the second coil conductor pattern. The first terminal conductor and the second terminal conductor are disposed at positions interposing the first coil conductor pattern when viewed in a stacking direction in which the plurality of insulating layers are stacked on each other. The second coil conductor pattern is disposed along the outer periphery of the first coil conductor pattern on the surface layer and in parallel or substantially in parallel with only a portion of the first coil conductor pattern. The second coil conductor pattern and the portion of the first coil conductor pattern that extend in parallel or substantially in parallel with each other define a parallel portion, and the electric current direction of the first coil conductor pattern, in the parallel portion, is the same or substantially the same as an electric current direction of the second coil conductor pattern. The parallel portion is disposed at a position adjacent to the first end portion in a direction in which the first coil conductor pattern extends.

In this configuration, the first coil conductor pattern and the second coil conductor pattern are in series to provide a coil. Similarly, the first coil conductor pattern and the second coil conductor pattern extend in parallel or substantially in parallel with each other to provide a capacitor. In other words, the conductor that provides a coil also provides a capacitor. Even when the first terminal conductor and the second terminal conductor are disposed at positions spaced away from each other, the positions at both ends of the coil substantially coincide with the positions at both ends of the capacitor, so that a desired LC parallel circuit is able to be achieved more accurately.

An electronic device according to a preferred embodiment of the present invention includes a multilayer substrate according to a preferred embodiment of the present invention and a circuit board that includes a conductor pattern, and the multilayer substrate further includes a wiring conductor pattern that connects the first end and the first terminal conductor or connects the fourth end and the second terminal conductor, a coil portion at which the first coil conductor pattern, the second coil conductor pattern, and the connection conductor pattern are disposed when viewed in the stacking direction of the plurality of insulating layers, and a wiring portion at which the wiring conductor pattern is provided when viewed in the stacking direction; the stacked body has flexibility and includes a first principal surface and a second principal surface that face each other; the first principal surface is the front surface of the surface layer on which the first coil conductor pattern and the second coil conductor pattern are provided; at least a portion of the coil portion is overlapped with the conductor pattern of the circuit board when viewed in the stacking direction; and a distance between the first principal surface and the conductor pattern in the portion in which the coil portion and the conductor pattern are overlapped with each other is larger than a distance between the second principal surface and the conductor pattern in the portion in which the coil portion and the conductor pattern are overlapped with each other.

With this configuration, as compared to a case in which the conductor pattern is disposed in proximity to the first principal surface of the stacked body, the distance between the coil portion and the conductor pattern is increased, so that an unnecessary capacitance to be generated between the coil portion and the conductor pattern is able to be reduced.

An electronic device according to a preferred embodiment of the present invention includes a multilayer substrate according to a preferred embodiment of the present invention, a circuit board, and a mounted component that is mounted on the circuit board, and the multilayer substrate further includes a wiring conductor pattern that connects the first end and the first terminal conductor or connects the fourth end and the second terminal conductor, a coil portion at which the first coil conductor pattern, the second coil conductor pattern, and the connection conductor pattern are disposed when viewed in the stacking direction of the plurality of insulating layers, and a wiring portion at which the wiring conductor pattern is provided when viewed in the stacking direction; the stacked body has flexibility and includes a first principal surface and a second principal surface that face each other; the first principal surface is the front surface of the surface layer on which the first coil conductor pattern and the second coil conductor pattern are provided; at least a portion of the coil portion is overlapped with the mounted component when viewed in the stacking direction; and a distance between the first principal surface and the mounted component in the portion in which the coil portion and the mounted component are overlapped with each other is larger than a distance between the second principal surface and the mounted component in the portion in which the coil portion and the mounted component are overlapped with each other.

With this configuration, as compared to a case in which the mounted component is disposed in proximity to the first principal surface of the stacked body, the distance between the coil portion and the mounted component is increased, so that an unnecessary capacitance to be generated between the coil portion and the mounted component is able to be reduced or prevented.

An electronic device according to a preferred embodiment of the present invention includes a multilayer substrate according to a preferred embodiment of the present invention, and the multilayer substrate further includes a wiring conductor pattern that connects the first end and the first terminal conductor or connects the fourth end and the second terminal conductor, a coil portion at which the first coil conductor pattern, the second coil conductor pattern, and the connection conductor pattern are disposed when viewed in the stacking direction of the plurality of insulating layers, and a wiring portion at which the wiring conductor pattern is provided when viewed in the stacking direction; the stacked body has flexibility and includes a first principal surface and a second principal surface that face each other; the first principal surface is the front surface of the surface layer on which the first coil conductor pattern and the second coil conductor pattern are provided; the multilayer substrate includes a bent portion in the wiring portion; at least a portion of the coil portion is overlapped with the first terminal conductor when viewed in the stacking direction; and a distance between the first principal surface and the first terminal conductor in the portion in which the coil portion and the first terminal conductor are overlapped with each other is larger than a distance between the second principal surface and the first terminal conductor in the portion in which the coil portion and the first terminal conductor are overlapped with each other.

With this configuration, as compared to a case in which the first terminal conductor is disposed in proximity to the first principal surface of the stacked body, the distance between the coil portion and the first terminal conductor is increased, so that an unnecessary capacitance to be generated between the coil portion and the first terminal conductor is able to be reduced.

According to preferred embodiments of the present invention, even when the first terminal conductor and the second terminal conductor are disposed at positions spaced away from each other, the positions at both ends of the coil coincide or substantially coincide with the positions at both ends of the capacitor, so that a desired LC parallel circuit is able to be achieved more accurately.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

First Preferred Embodiment

Figure 1:
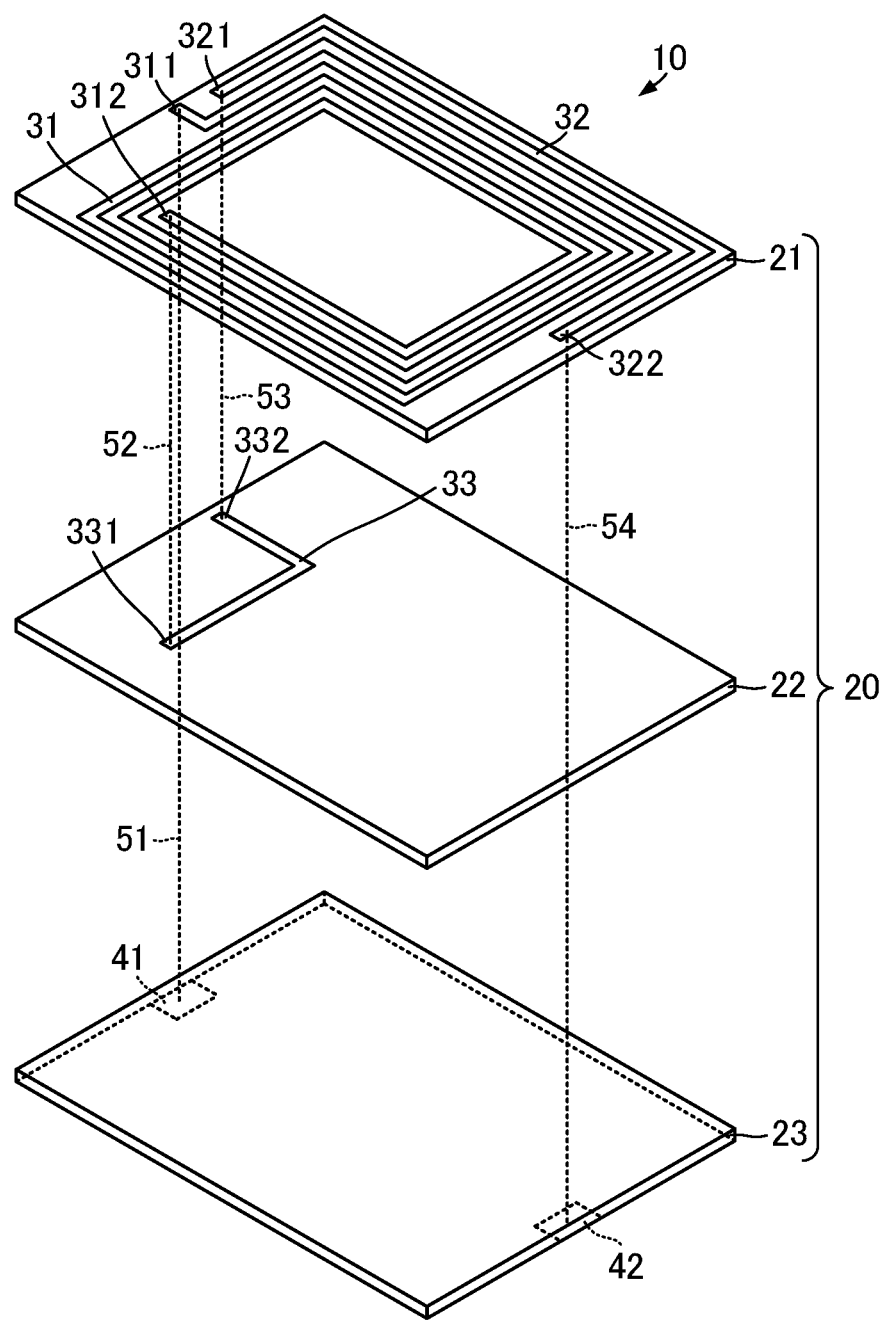
FIG. 1 is an exploded perspective view of a multilayer substrate 10 according to a first preferred embodiment of the present invention.
Figure 2A:
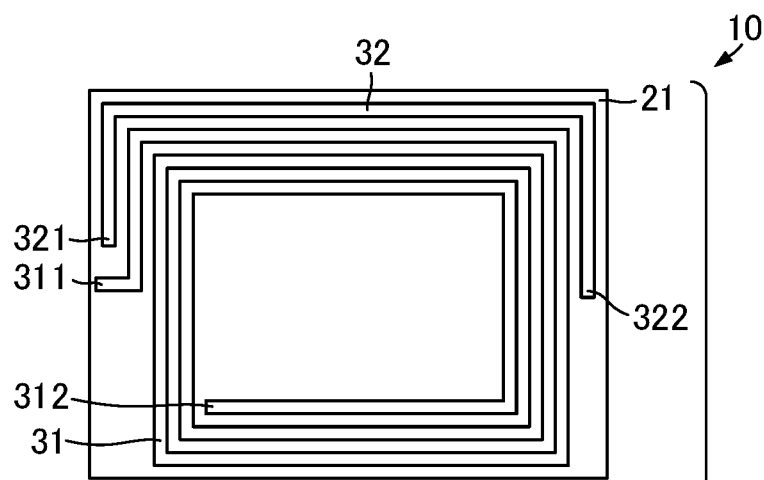
FIGS. 2A, 2B and 2C are exploded plan views of the multilayer substrate 10 according to the first preferred embodiment of the present invention.
Figure 2B:
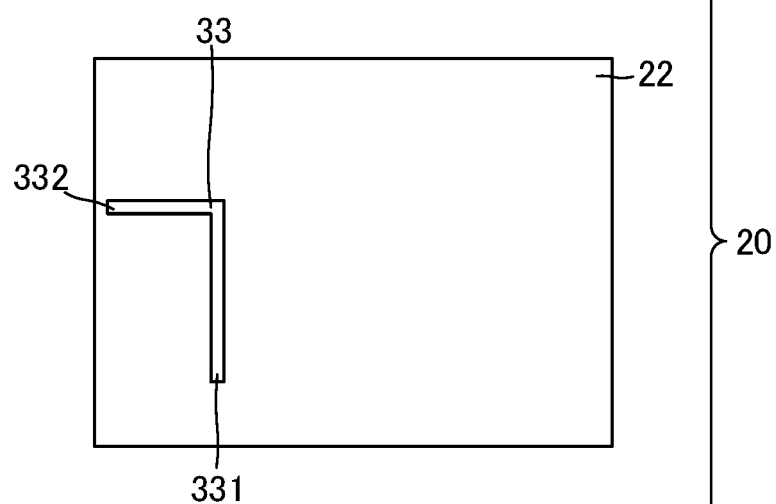
Figure 2C:
Figure 3:
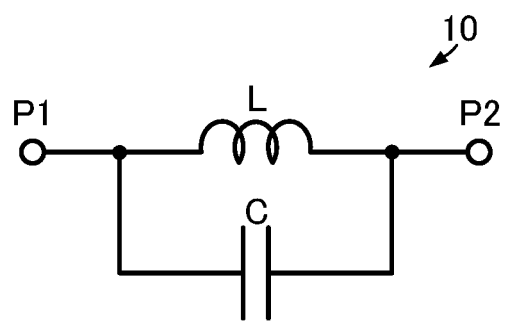
FIG. 3 is an equivalent circuit diagram of the multilayer substrate 10 according to the first preferred embodiment of the present invention.

A multilayer substrate according to a first preferred embodiment of the present invention will be described with reference to the drawings. FIG. 1 is an exploded perspective view of a multilayer substrate 10 according to the first preferred embodiment of the present invention. FIGS. 2A, 2B and 2C are exploded plan views of the multilayer substrate 10 according to the first preferred embodiment of the present invention. FIG. 3 is an equivalent circuit diagram of the multilayer substrate 10 according to the first preferred embodiment of the present invention.

As illustrated in FIG. 3, the multilayer substrate 10 includes a coil L, a capacitor C, and input and output terminals P1 and P2. The coil L and the capacitor C are connected in parallel to define a parallel circuit. This parallel circuit is connected between the input/output terminal P1 and the input/output terminal P2. According to this configuration, the multilayer substrate 10 defines and functions as a filter including an LC parallel resonant circuit.

As illustrated in FIGS. 1, 2A, 2B and 2C, the multilayer substrate 10 includes a stacked body 20, coil conductor patterns 31 and 32, a connection conductor pattern 33, a terminal conductor 41, and a terminal conductor 42. The coil conductor pattern 31 corresponds to the "first coil conductor pattern", and the coil conductor pattern 32 corresponds to the "second coil conductor pattern".

The stacked body 20 preferably has a rectangular or substantially rectangular parallelepiped shape, and includes an insulating layer 21, an insulating layer 22, and an insulating layer 23. The insulating layer 21, the insulating layer 22, and the insulating layer 23 are stacked in this order. The insulating layer 21, the insulating layer 22, and the insulating layer 23 are preferably made of, for example, an insulating resin, such as liquid crystal polymer. The insulating layer 21 is an insulating layer on the surface layer of the stacked body 20.

The coil conductor patterns 31 and 32 are provided on the front surface of the insulating layer 21, that is, the front surface of the stacked body 20. The coil conductor patterns 31 and 32 are preferably made of a material having high workability and high electrical conductivity such as copper, for example.

The coil conductor pattern 31 is preferably a linear conductor, and has a spiral shape defined by a wound shape including a plurality of turns. The coil conductor pattern 31 includes an outer end portion 311 at one end in a direction in which the coil conductor pattern 31 extends, and an inner end portion 312 at the other end. The outer end portion 311 is an end portion that is located at the outermost periphery of the spiral shape, and the inner end portion 312 is an end portion that is located at the innermost periphery of the spiral shape. The outer end portion 311 corresponds to the "first end portion", and the inner end portion 312 corresponds to the "second end portion".

The coil conductor pattern 32 is preferably a linear conductor. The coil conductor pattern 32 includes an end portion 321 at one end in a direction in which the coil conductor pattern 32 extends, and includes an end portion 322 at the other end. The end portion 321 corresponds to the "third end portion", and the end portion 322 corresponds to the "fourth end portion". The coil conductor pattern 32 extends in parallel or substantially in parallel with the coil conductor pattern 31 along the outer periphery of the coil conductor pattern 31. More specifically, as illustrated in FIGS. 1, 2A, 2B and 2C, the end portion 321 is disposed in proximity to the outer end portion 311 of the coil conductor pattern 31. The coil conductor pattern 32 extends in parallel or substantially in parallel with the coil conductor pattern 31 along a portion of the outermost periphery that extends from the outer end portion 311 of the coil conductor pattern 31. The end portion 322 is disposed in proximity to an intermediate position of the portion of the outermost periphery of the coil conductor pattern 31.

In this configuration, the coil conductor pattern 31 and the coil conductor pattern 32 face each other by a predetermined length, in the vicinity of the outer end portion 311 of the coil conductor pattern 31. A portion in which the coil conductor pattern 31 and the coil conductor pattern 32 face each other defines the capacitor C illustrated in FIG. 3.

The connection conductor pattern 33 is provided on the surface of the insulating layer 22 adjacent to the insulating layer 21. The connection conductor pattern 33 is preferably a linear conductor and is made of the same material as the material of the coil conductor patterns 31 and 32. The connection conductor pattern 33 includes an end portion 331 at one end in a direction in which the connection conductor pattern 33 extends, and an end portion 332 at the other end.

The end portion 331 is overlapped with the inner end portion 312 of the coil conductor pattern 31 in the stacking direction. The end portion 331 and the inner end portion 312 are connected by an interlayer connection conductor 52 shaped to extend in the stacking direction.

The end portion 332 is overlapped with the end portion 321 of the coil conductor pattern 32 in the stacking direction. The end portion 332 and the end portion 321 are connected by an interlayer connection conductor 53 that extends in the stacking direction.

In this configuration, the inner end portion 312 of the coil conductor pattern 31 and the end portion 321 of the coil conductor pattern 32 are connected by the connection conductor pattern 33 and the interlayer connection conductors 52 and 53. Therefore, the coil conductor pattern 31 and the coil conductor pattern 32 are connected to define a coil. This coil is the coil L illustrated in FIG. 3.

The terminal conductors 41 and 42 are provided on the surface (the back surface of the stacked body 20) of the insulating layer 23 opposite to the insulating layer 22. The terminal conductor 41 corresponds to the "first terminal conductor", and the terminal conductor 42 corresponds to the "second terminal conductor". The terminal conductors 41 and 42 preferably each have a rectangular or substantially rectangular shape including a predetermined area. The terminal conductor 41 corresponds to the input/output terminal P1 of FIG. 3, and the terminal conductor 42 corresponds to the input/output terminal P2 of FIG. 3.

The terminal conductor 41 is overlapped with the outer end portion 311 of the coil conductor pattern 31 in the stacking direction. The terminal conductor 41 and the outer end portion 311 are connected by the interlayer connection conductor 51 that extends in the stacking direction.

The terminal conductor 42 is overlapped with the end portion 322 of the coil conductor pattern 32 in the stacking direction. The terminal conductor 42 and the end portion 322 are connected by an interlayer connection conductor 54 that extends in the stacking direction.

According to this configuration, the circuit illustrated in FIG. 3 is able to be achieved. Then, with such a configuration, the electric current direction of the coil conductor pattern 31 is the same or substantially the same as the electric current direction of the coil conductor pattern 32 in an opposed portion in which the coil conductor pattern 31 and the coil conductor pattern 32 are opposed to each other.

Then, since, with this configuration, the capacitor C is defined by the coil conductor pattern 31 provided on the front surface of the stacked body 20 and the opposed portion in which the coil conductor pattern 31 and the coil conductor pattern 32 are opposed to each other, a conductor portion that defines the capacitor C is difficult to provide a capacitance to an external circuit element, a conductor pattern, or other circuit element. In addition, the multilayer substrate 10 includes the terminal conductors 41 and 42 provided only on the back surface of the stacked body 20. The terminal conductors 41 and 42 are preferably not overlapped with the opening of the coil conductor pattern 31 when the multilayer substrate 10 is viewed in the Z-direction, and are also preferably not overlapped with the coil conductor patterns 31 and 32 to the greatest extent possible, except a portion to be connected by the interlayer connection conductors 51 and 54. It is to be noted that the terminal conductors 41 and 42 may not be provided on the back surface of the stacked body 20, and may be provided on the front surface.

In the multilayer substrate 10, a predetermined length portion (a predetermined length portion adjacent to the terminal conductor 41 in the coil conductor pattern 31) adjacent to the input/output terminal P1 of the coil L in the circuit and a predetermined portion (the coil conductor pattern 32) adjacent to the input/output terminal P2 of the coil L in the circuit generate a capacitance. Therefore, in an equivalent circuit, the end portion adjacent to the input/output terminal P1 of the coil L and the end portion adjacent to the input/output terminal P1 of the capacitor C coincide or substantially coincide with each other. Further, the end portion adjacent to the input and output terminal P2 of the coil L and the end portion adjacent to the input and output terminal P2 of the capacitor C coincide or substantially coincide with each other.

Accordingly, the multilayer substrate 10 is able to achieve an LC parallel resonant circuit that has a large capacitance, and reliably achieve a desired capacitance. As a result, the multilayer substrate 10 is able to reliably achieve desired filter characteristics.

In addition, in the multilayer substrate 10, since the electric current direction of the coil conductor pattern 31 and the electric current direction of the coil conductor pattern 32 are the same or substantially the same in the opposed portion, mutual magnetic fields do not cancel each other, so that a large inductance is able to be obtained by a small stacked body 20.

It is to be noted that, by making the connection conductor pattern 33 as short as possible, the design of the inductance of the coil L defined by the coil conductor patterns 31 and 32 is facilitated. However, the inductance of the coil L may be designed in consideration of the length of the connection conductor pattern 33. In such a case, the length of the connection conductor pattern 33 may be determined according to the inductance of the coil L. In addition, the length of an overlapping portion in which the connection conductor pattern 33 is overlapped with the coil conductor pattern 31 may preferably be reduced. Further, in the overlapping portion, the direction in which the coil conductor pattern 31 extends and the direction in which the connection conductor pattern 33 extends may preferably be perpendicular or substantially perpendicular to each other. As a result, the coil conductor pattern 31 and the connection conductor pattern 33 is able to be significantly reduced or prevented from being coupled to each other, and desired filter characteristics are able to be reliably achieved.

Second Preferred Embodiment

Figure 4:
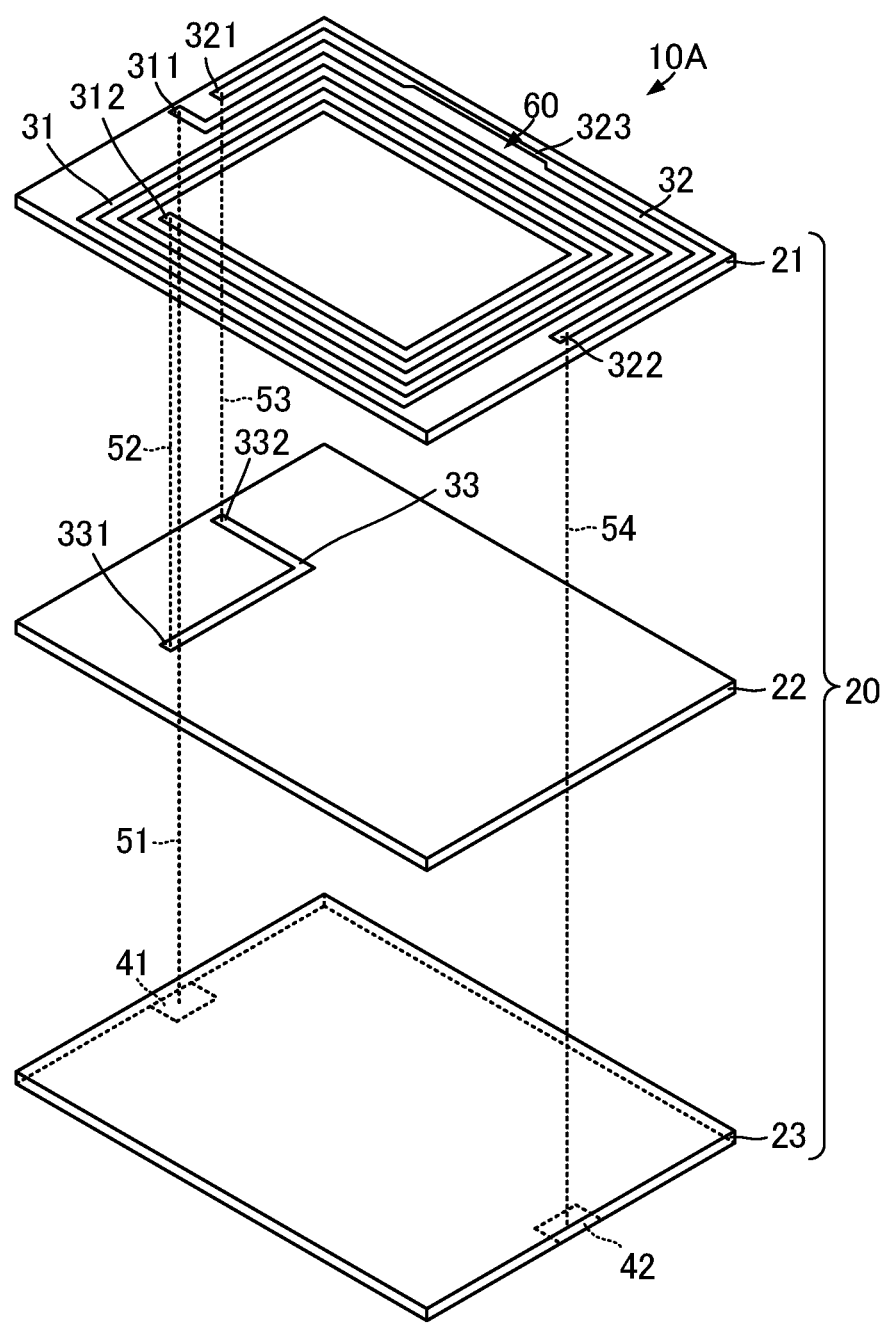
FIG. 4 is an exploded perspective view of a multilayer substrate 10A according to a second preferred embodiment of the present invention.

A multilayer substrate according to a second preferred embodiment of the present invention will be described with reference to the drawings. FIG. 4 is an exploded perspective view of the multilayer substrate according to the second preferred embodiment of the present invention.

A multilayer substrate 10A according to the second preferred embodiment is different from the multilayer substrate 10 according to the first preferred embodiment in that a separation distance adjusting portion 60 is provided. Other configurations of the multilayer substrate 10A are the same as or similar to the configurations of the multilayer substrate 10, and a description of the same or similar configuration will be omitted.

The separation distance adjusting portion 60 is a portion in which the distance between the coil conductor pattern 31 and the coil conductor pattern 32 is partially made different in the opposed portion in which the coil conductor pattern 31 and the coil conductor pattern 32 are opposed to each other. Specifically, a portion corresponding to the separation distance adjusting portion 60 in the coil conductor pattern 32 is defined as a narrow portion 323.

With such a configuration, the capacitance of the capacitor C is able to be adjusted. Accordingly, desired filter characteristics are able to be more reliably achieved.

Third Preferred Embodiment

Figure 5:
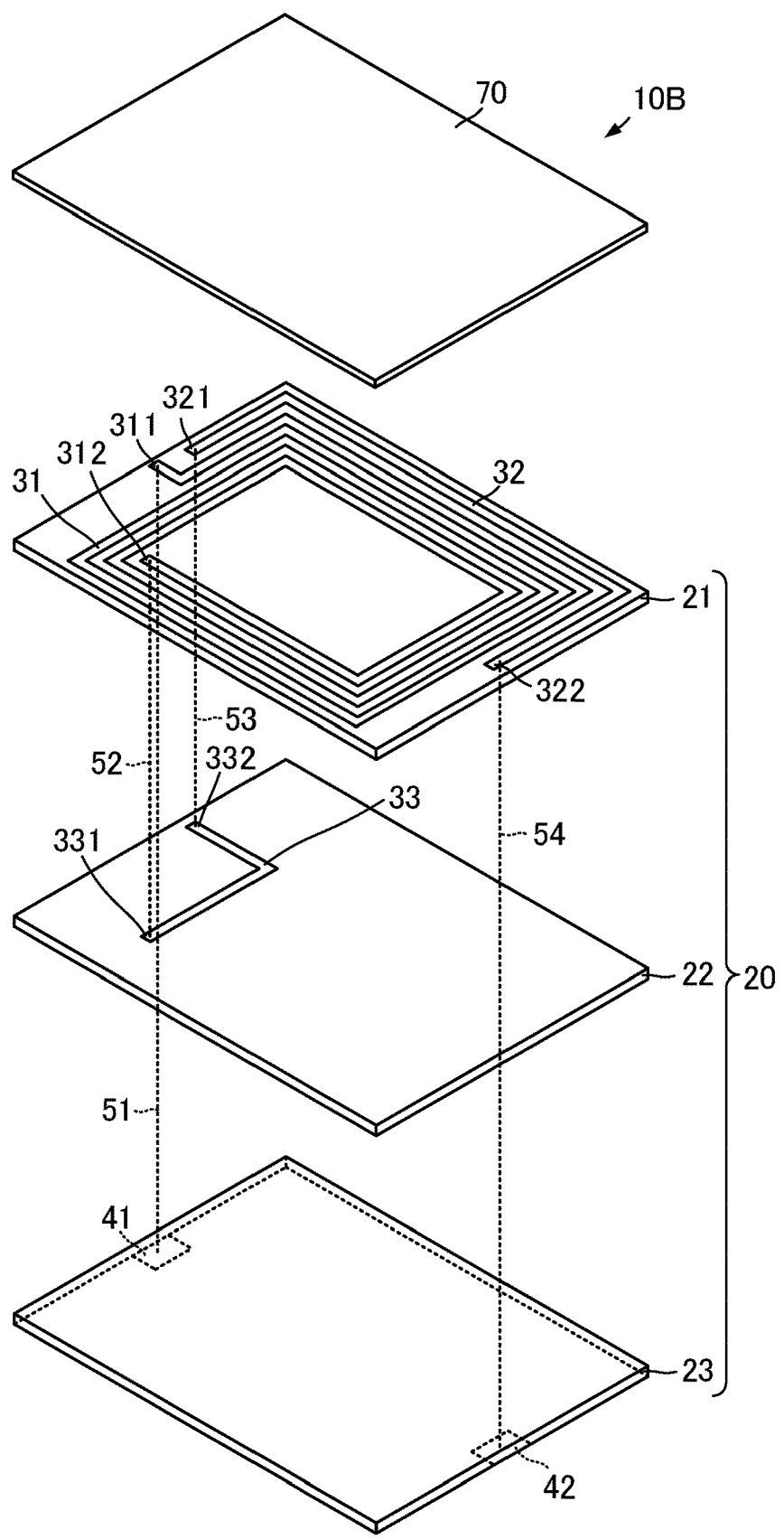
FIG. 5 is an exploded perspective view of a multilayer substrate 10B according to a third preferred embodiment of the present invention.

A multilayer substrate according to a third preferred embodiment of the present invention will be described with reference to the drawings. FIG. 5 is an exploded perspective view of a multilayer substrate according to the third preferred embodiment of the present invention.

A multilayer substrate 10B according to the third preferred embodiment is different from the multilayer substrate 10 according to the first preferred embodiment in that a dielectric layer 70 is provided. Other configurations of the multilayer substrate 10B are the same as or similar to the configurations of the multilayer substrate 10, and a description of the same or similar configuration will be omitted.

The multilayer substrate 10B includes a dielectric layer 70. The dielectric layer 70 is disposed on the front surface of the stacked body 20. The dielectric layer 70 covers a coil conductor pattern 31 and a coil conductor pattern 32. It is to be noted that the dielectric layer 70 may preferably include no conductor patterns. As a result, an unnecessary capacitance to the coil conductor patterns 31 and 32 is able to be significantly reduced or prevented from being generated. In addition, the dielectric layer 70 may be a layer having a magnetic property as long as the layer has an insulating property. As a result, the inductance is able to be increased.

In such a configuration, the capacitance of the capacitor C also depends on the relative permittivity of the dielectric layer 70. Accordingly, the relative permittivity of the dielectric layer 70 is set to a desired relative permittivity, so that the capacitance of the capacitor C is able to be set to a desired capacitance. As a result, desired filter characteristics are able to be more reliably achieved.

It is to be noted that the relative permittivity of the dielectric layer 70 may preferably be larger than the relative permittivity of the insulating layers 21, 22, and 23. As a result, a large capacitance is able to be easily obtained, and, for example, a range in which filter characteristics are able to be achieved is able to be expanded.

Fourth Preferred Embodiment

Figure 6:
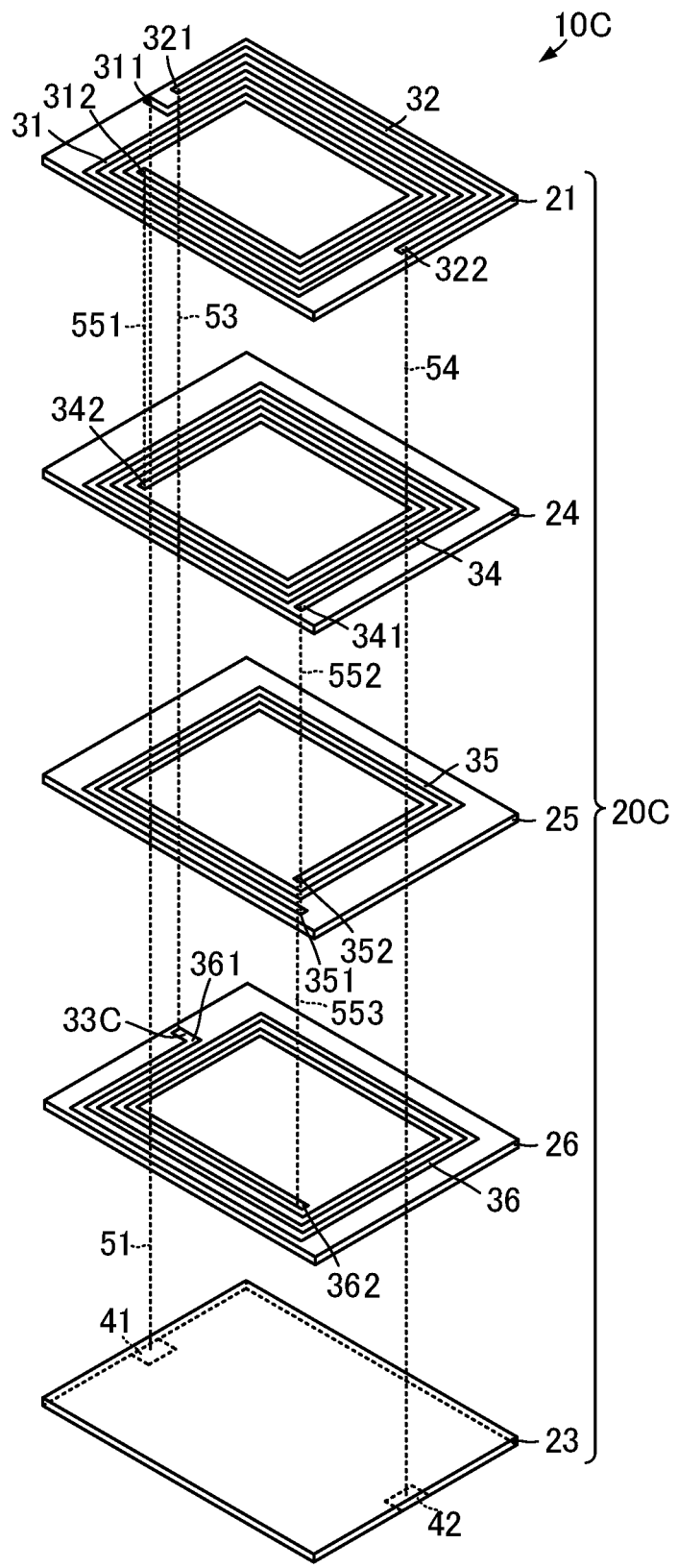
FIG. 6 is an exploded perspective view of a multilayer substrate 10C according to a fourth preferred embodiment of the present invention.

A multilayer substrate according to a fourth preferred embodiment of the present invention will be described with reference to the drawings. FIG. 6 is an exploded perspective view of a multilayer substrate according to the fourth preferred embodiment of the present invention.

A multilayer substrate 10C according to the fourth preferred embodiment is different from the multilayer substrate 10 according to the first preferred embodiment in that a spiral-shaped coil conductor pattern is provided on a plurality of layers. Other configurations of the multilayer substrate 10C are the same as or similar to the configurations of the multilayer substrate 10, and a description of the same or similar configuration will be omitted.

The multilayer substrate 10C includes a stacked body 20C, coil conductor patterns 31, 32, 34, 35, and 36, and a connection conductor pattern 33C. The stacked body 20C includes insulating layers 21, 23, 24, 25, and 26. The insulating layers 21, 23, 24, 25, and 26 are stacked from the front surface to the back surface of the stacked body 20C in order of the insulating layer 21, the insulating layer 24, the insulating layer 25, the insulating layer 26, and the insulating layer 23.

The coil conductor patterns 31 and 32 are the same or substantially the same as the coil conductor patterns 31 and 32 according to the first preferred embodiment of the present invention. Each of the coil conductor patterns 34, 35, and 36 preferably has a spiral shape, for example. The coil conductor pattern 34 is provided on the surface of the insulating layer 24 adjacent to the insulating layer 21. The coil conductor pattern 35 is provided on the surface of the insulating layer 25 adjacent to the insulating layer 24. The coil conductor pattern 36 and the connection conductor pattern 33C are provided on the surface of the insulating layer 26 adjacent to the insulating layer 25.

The inner end portion 312 of the coil conductor pattern 31 is connected to an inner end portion 342 of the coil conductor pattern 34 through an interlayer connection conductor 551. An outer end portion 341 of the coil conductor pattern 34 is connected to an outer end portion 351 of the coil conductor pattern 35 through an interlayer connection conductor 552. An inner end portion 352 of the coil conductor pattern 35 is connected to an inner end portion 362 of the coil conductor pattern 36 through an interlayer connection conductor 553. An outer end portion 361 of the coil conductor pattern 36 is connected to an end portion 321 of the coil conductor pattern 32 through the connection conductor pattern 33C and the interlayer connection conductor 53.

In this configuration, as in the first preferred embodiment, the opposed portion in which the coil conductor pattern 31 and the coil conductor pattern 32 are opposed to each other provides a capacitor C. In addition, the coil conductor patterns 31, 34, 35, 36, and 32 provide a coil L. As described above, even when the spiral-shaped coil conductor patterns 31, 34, 35, 36, and 32 are provided on a plurality of layers, as in the first preferred embodiment, an unnecessary capacitance is able to be significantly reduced or prevented from being generated, and desired filter characteristics are able to be reliably achieved. In addition, with the configuration according to the fourth preferred embodiment of the present invention, the length of the coil conductor pattern that provides the coil L is increased, so that the inductance is able to be increased. In such a case, the capacitance of the capacitor C is hardly changed. In other words, the capacitance of the LC parallel resonant circuit is hardly changed, and the inductance is able to be increased.

Fifth Preferred Embodiment

Figure 7A:
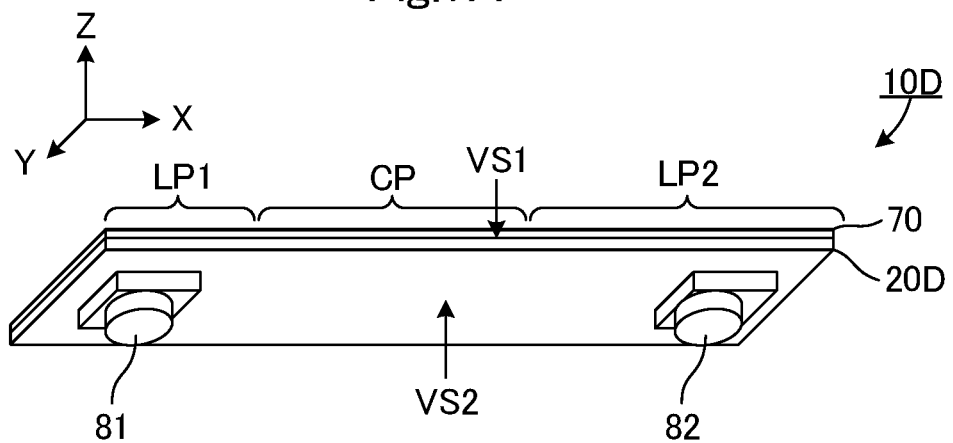
FIG. 7A is an external perspective view of a multilayer substrate 10D according to a fifth preferred embodiment of the present invention and FIG. 7B is an exploded perspective view of the multilayer substrate 10D.
Figure 7B:
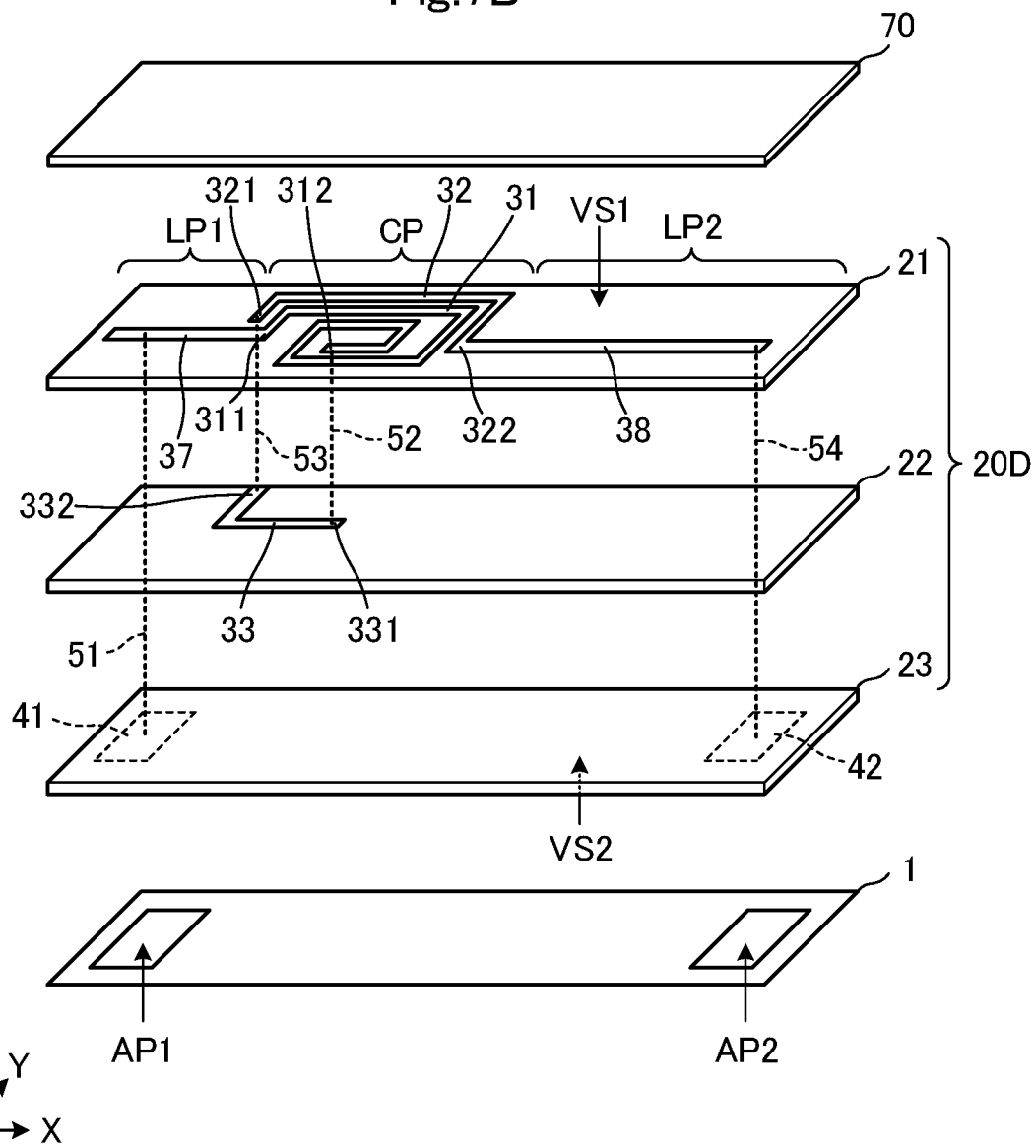

A multilayer substrate according to a fifth preferred embodiment of the present invention will be described with reference to the drawings. FIG. 7A is an external perspective view of a multilayer substrate 10D according to the fifth preferred embodiment of the present invention and FIG. 7B is an exploded perspective view of the multilayer substrate 10D. It is to be noted that the illustration of connectors 81 and 82 is omitted in FIG. 7B.

A multilayer substrate 10D according to the fifth preferred embodiment is different in the shape of the stacked body from the multilayer substrate 10 according to the first preferred embodiment. In addition, the multilayer substrate 10D is different from the multilayer substrate 10 according to the first preferred embodiment in that connectors 81 and 82, a dielectric layer 70, and a protective layer 1 are provided. Other configurations of the multilayer substrate 10D are the same as or similar to the configurations of the multilayer substrate 10, and a description of the same or similar configuration will be omitted.

The multilayer substrate 10D includes a stacked body 20D, coil conductor patterns 31 and 32, wiring conductor patterns 37 and 38, a protective layer 1, a dielectric layer 70, connectors 81 and 82, a coil portion CP, wiring portions LP1 and LP2, a terminal conductor 41, and a terminal conductor 42.

The stacked body 20D preferably has a flexible rectangular or substantially rectangular flat plate shape, and includes an insulating layer 21, an insulating layer 22, and an insulating layer 23. The insulating layer 21, the insulating layer 22, and the insulating layer 23 are stacked in this order. The stacked body 20D includes a first principal surface VS1 and a second principal surface VS2 that face with each other. The insulating layer 21 is an insulating layer on the surface layer of the stacked body 20D, and the front surface of the insulating layer 21 illustrated in FIG. 7B is the first principal surface VS1 of the stacked body 20D. In addition, the back surface of the insulating layer 23 illustrated in FIG. 7B is the second principal surface VS2 of the stacked body 20D.

The coil conductor patterns 31 and 32 and the wiring conductor patterns 37 and 38 are provided on the front surface of the insulating layer 21, that is, the first principal surface VS1 of the stacked body 20D. The coil conductor patterns 31 and 32 are disposed at positions closer to one end (the left end of the insulating layer 21 in FIG. 7B) from the center of the insulating layer 21. The wiring conductor patterns 37 and 38 are preferably linear conductors extending in the longitudinal direction (the X-axis direction) of the insulating layer 21. One end of the wiring conductor pattern 37 is connected to the outer end portion 311 of the coil conductor pattern 31. One end of the wiring conductor pattern 38 is connected to the end portion 322 of the coil conductor pattern 32.

The connection conductor pattern 33 is provided on the surface of the insulating layer 22 adjacent to the insulating layer 21. The connection conductor pattern 33 is disposed at a position closer to one end (the left end of the insulating layer 22 in FIG. 7B) from the center of the insulating layer 22.

The terminal conductors 41 and 42 are provided on the surface (the back surface of the stacked body 20D, that is, the second principal surface VS2 of the stacked body 20D) of the insulating layer 23 opposite to the insulating layer 22. The terminal conductor 41 is disposed adjacent to one end (the left end of the insulating layer 23 in FIG. 7B) of the insulating layer 23. The terminal conductor 42 is disposed adjacent to the other end (the right end of the insulating layer 23 in FIG. 7B) of the insulating layer 23.

The terminal conductor 41 is overlapped with the other end of the wiring conductor pattern 37 in the stacking direction. The terminal conductor 41 and the other end of the wiring conductor pattern 37 are connected by the interlayer connection conductor 51 that extends in the stacking direction. As described above, the wiring conductor pattern 37 and the interlayer connection conductor 51 connect the outer end portion 311 (the first end portion) and the terminal conductor 41 (the first terminal conductor).

The terminal conductor 42 is overlapped with the other end of the wiring conductor pattern 38 in the stacking direction. The terminal conductor 42 and the other end of the wiring conductor pattern 38 are connected by the interlayer connection conductor 54 that extends in the stacking direction. As described above, the wiring conductor pattern 38 and the interlayer connection conductor 54 connect the end portion 322 (the fourth end portion) and the terminal conductor 42 (the second terminal conductor).

The dielectric layer 70 is disposed on the front surface (the first principal surface VS1) of the stacked body 20D. The dielectric layer 70 covers the coil conductor pattern 31 and the coil conductor pattern 32. The dielectric layer 70 may be a layer having a magnetic property as long as the layer has an insulating property. As a result, the inductance is able to be increased.

The protective layer 1 is disposed on the back surface (the second principal surface VS2) of the stacked body 20D. The protective layer 1 includes opening portions AP1 and AP2 at portions corresponding to the positions of the terminal conductors 41 and 42. Therefore, even when the protective layer 1 covers the second principal surface VS2, the terminal conductors 41 and 42 are exposed on the second principal surface VS2. The protective layer 1 is preferably, for example, a solder resist film, a coverlay film, or other suitable layer. It is to be noted that the protective layer 1 is not essential.

The connector 81 is mounted on the second principal surface VS2 of the stacked body 20D and disposed adjacent to one end (the left end of the stacked body 20D in FIG. 7A) of the stacked body 20D. The connector 81 is joined to the terminal conductor 41 exposed on the second principal surface VS2 through a conductive joining material, such as solder, for example.

The connector 82 is mounted on the second principal surface VS2 of the stacked body 20D and disposed adjacent to the other end (the right end of the stacked body 20D in FIG. 7A) of the stacked body 20D. The connector 82 is joined to the terminal conductor 42 exposed on the second principal surface VS2 through a conductive joining material, such as solder, for example.

The coil portion CP is a portion at which, when the multilayer substrate 10D is viewed in the stacking direction of the plurality of insulating layers 21, 22, and 23, the coil conductor patterns 31 and 32 and the connection conductor pattern 33 are disposed. In addition, the wiring portions LP1 and LP2 are portions other than the coil portion CP, and are portions at which, when the multilayer substrate 10D is viewed in the stacking direction, the wiring conductor patterns 37 and 38 are disposed.

As described above, the multilayer substrate including the coil portion CP and the wiring portions LP1 and LP2 (transmission lines) is able to be obtained.

In the multilayer substrate 10D according to the fifth preferred embodiment of the present invention, the capacitance of the capacitor (see the capacitor C illustrated in FIG. 3) also depends on the relative permittivity of the dielectric layer 70. Accordingly, the relative permittivity of the dielectric layer 70 is set to a desired relative permittivity, so that the capacitance of the capacitor is able to be set to a desired capacitance. As a result, desired filter characteristics are able to be more reliably achieved.

It is to be noted that the relative permittivity of the dielectric layer 70 may preferably be larger than the relative permittivity of the insulating layers 21, 22, and 23. As a result, a large capacitance is able to be easily obtained, and, for example, a range in which filter characteristics are able to be achieved is able to be expanded.

Figure 8:
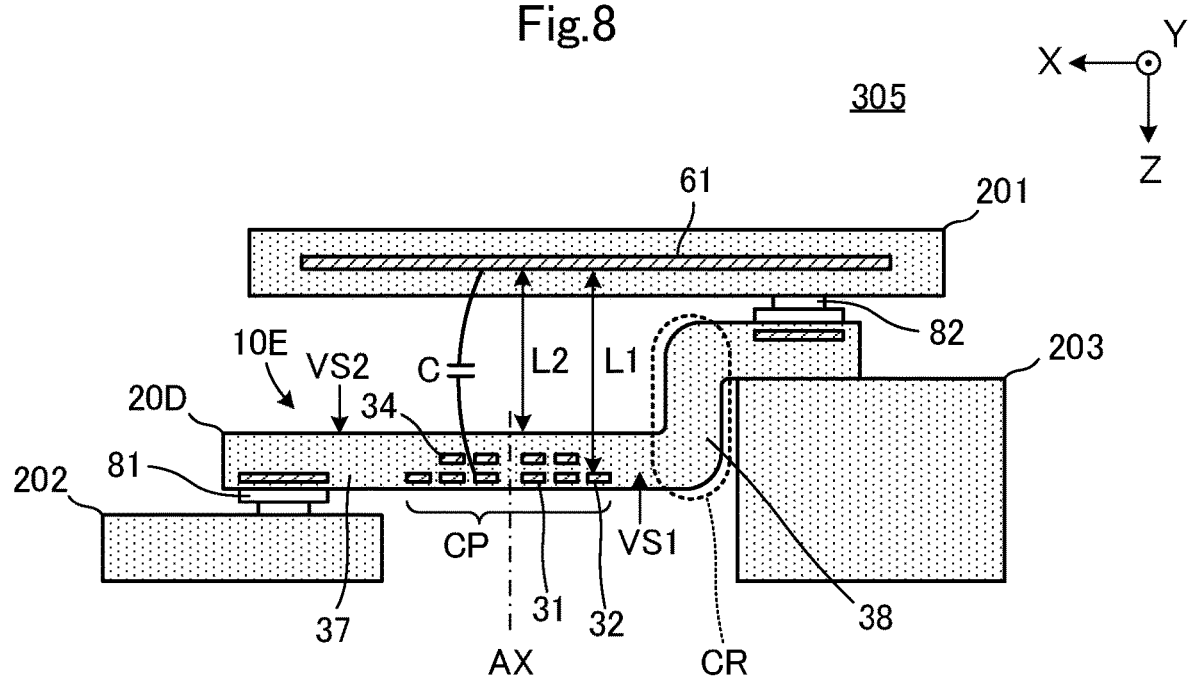
FIG. 8 is a cross-sectional view of a main portion of an electronic device 305 according to the fifth preferred embodiment of the present invention.

Subsequently, an electronic device including a multilayer substrate according to a preferred embodiment of the present invention will be described with reference to the drawings. FIG. 8 is a cross-sectional view of a main portion of an electronic device 305 according to the fifth preferred embodiment of the present invention.

The electronic device 305 includes a multilayer substrate 10E and circuit boards 201, 202, and 203. The circuit boards 201, 202, and 203 are, for example, printed circuit board.

The multilayer substrate 10E is different from the multilayer substrate 10D in that a connector 82 is mounted on the second principal surface VS2 of the stacked body 20D. In addition, the multilayer substrate 10E is different from the multilayer substrate 10D in that a coil conductor pattern 34 is provided and a wiring portion includes a bent portion CR. Other configurations of the multilayer substrate 10E are the same or substantially the same as the configurations of the multilayer substrate 10D.

The coil conductor pattern 34 preferably has a spiral shape. The multilayer substrate 10E, as in the third preferred embodiment, includes spiral-shaped coil conductor patterns 31 and 34 on a plurality of layers. In other words, the spiral-shaped coil conductor patterns 31 and 34 are provided on different insulating layers, respectively.

An inner end portion of the coil conductor pattern 31, which is not illustrated, is connected to an inner end portion of the coil conductor pattern 34 through an interlayer connection conductor. An outer end portion of the coil conductor pattern 34 is connected to the end portion of the coil conductor pattern 32 through a connection conductor pattern and an interlayer connection conductor.

As illustrated in FIG. 8, the multilayer substrate 10E, in a state of being bent along the outline of the circuit board 203, is connected to each of the circuit boards 201 and 202. Specifically, the connector 81 of the multilayer substrate 10E is connected to a receptacle (not illustrated) mounted on the circuit board 202. In addition, the connector 82 is connected to a receptacle (not illustrated) mounted on the circuit board 201. This circuit board 201 includes a conductor pattern 61 therein.

As illustrated in FIG. 8, at least a portion of the coil portion CP, when viewed in the stacking direction (a coil axis AX or the Z-axis direction), is overlapped with the conductor pattern of the circuit board 201. In a portion in which the coil portion CP and the conductor pattern 61 are overlapped with each other, a distance L1 between the first principal surface VS1 and the conductor pattern 61 is larger than a distance L2 between the second principal surface VS2 and the conductor pattern 61 (L1>L2).

In the electronic device 305 according to the fifth preferred embodiment, in the portion in which the coil portion CP and the conductor pattern 61 are overlapped with each other, the coil conductor pattern 61 that is provided on the circuit board 201 is spaced farther away from the first principal surface VS1 including the coil conductor patterns 31 and 32 than from the second principal surface VS2. Therefore, as compared to a case in which the conductor pattern 61 is disposed in proximity to the first principal surface VS1 of the stacked body 20D, the distance between the coil portion CP and the conductor pattern 61 is increased, so that an unnecessary capacitance (a stray capacitance) to be generated between the coil portion CP and the conductor pattern 61 is able to be reduced or prevented.

In addition, even when, as in the electronic device 305, the spiral-shaped coil conductor patterns 31 and 34 are provided on a plurality of layers, the conductor pattern 61 is preferably spaced farther away from the first principal surface VS1 than from the second principal surface VS2. The coil conductor pattern (the coil conductor patterns 31 and 32) provided on the first principal surface VS1 has a large conductor area, as compared to the coil conductor pattern (the coil conductor pattern 34) provided on another layer. Therefore, the conductor pattern 61 is spaced farther away from the first principal surface VS1 having a relatively large conductor area than from the second principal surface VS2, so that an unnecessary capacitance (a stray capacitance) to be generated between the coil portion CP and the conductor pattern 61 is able to be reduced or prevented.

In particular, in a case in which the dielectric layer 70 is disposed on the first principal surface VS1, the conductor pattern 61 is preferably spaced farther away from the first principal surface VS1 than from the second principal surface VS2.

It is to be noted that, in a case in which the multilayer substrate includes a bent portion, positional shift, deformation, or other deviations of the coil conductor pattern are easily caused, and thus an unnecessary capacitance (a stray capacitance) to be generated between the coil portion CP and the conductor pattern 61 is easily changed. Therefore, the conductor pattern 61 is spaced farther from the first principal surface VS1 having a relatively large conductor area than from the second principal surface VS2, so that a change in the amount of an unnecessary capacitance (a stray capacitance) caused by the bending of the multilayer substrate is able to be reduced or prevented.

In addition, for the following reasons, as in the multilayer substrate 10E, the bent portion CR is preferably provided in the wiring portion. Generally, the rigidity of a conductor pattern is relatively higher than the rigidity of an insulating layer made of a resin material. Therefore, the wiring portion, as compared to the coil portion CP with a high conductor ratio, has a high flexibility and is easily deformed. In addition, in a case in which the coil portion CP is deformed, the coil characteristics (inductor characteristics) of the coil (see the coil L illustrated in FIG. 3) with which the multilayer substrate is provided may be varied.

Sixth Preferred Embodiment

Figure 9:
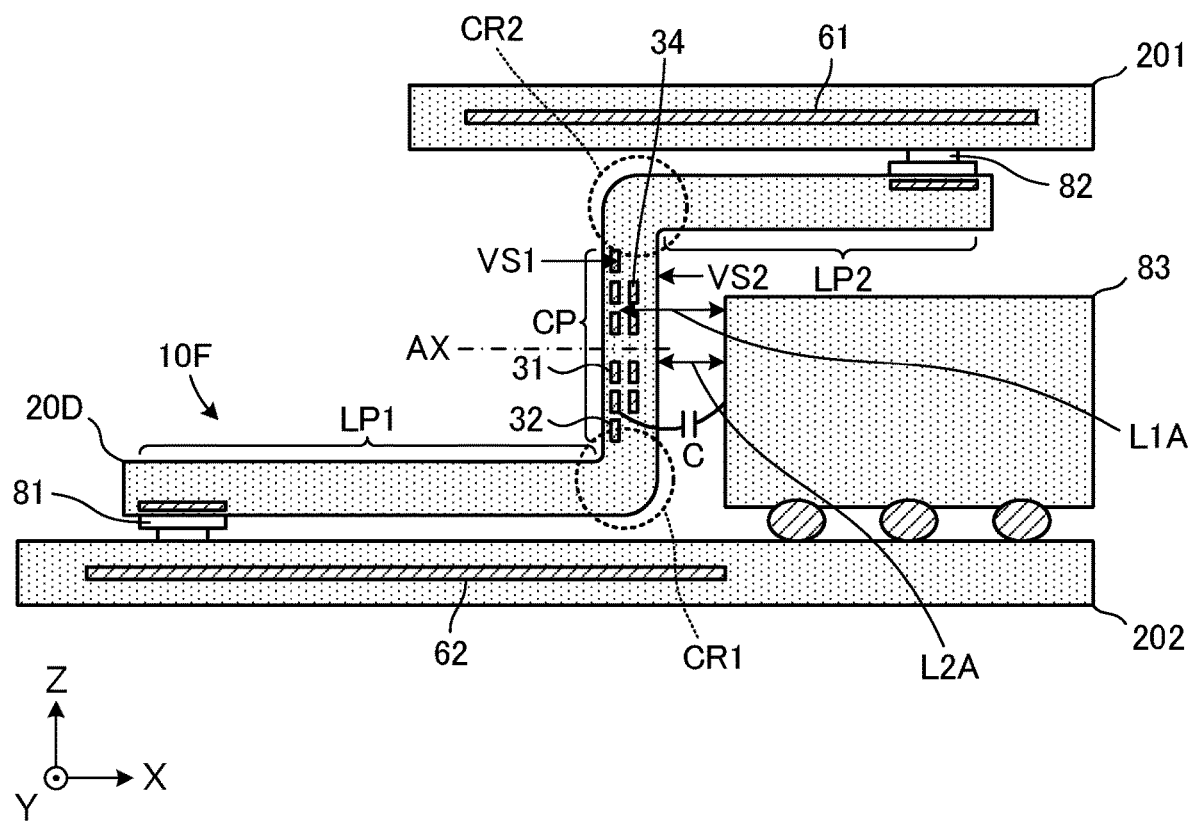
FIG. 9 is a cross-sectional view of a main portion of an electronic device 306 according to a sixth preferred embodiment of the present invention.

An electronic device according to a sixth preferred embodiment of the present invention will be described with reference to the drawings. FIG. 9 is a cross-sectional view of a main portion of an electronic device 306 according to the sixth preferred embodiment of the present invention.

The electronic device 306 includes a multilayer substrate 10F and circuit boards 201 and 202, and a mounted component 83.

The multilayer substrate 10F is different from the multilayer substrate 10D according to the fifth preferred embodiment in that a connector 82 is mounted on the second principal surface VS2 of the stacked body 20D. In addition, the multilayer substrate 10F is different from the multilayer substrate 10D in that wiring portions LP1 and LP2 respectively include bent portions CR1 and CR2 and a coil conductor pattern 34 is provided. Other configurations of the multilayer substrate 10F are the same or substantially the same as the configurations of the multilayer substrate 10D.

The coil conductor pattern 34 preferably has a spiral shape. The multilayer substrate 10F, as in the third preferred embodiment, includes spiral-shaped coil conductor patterns 31 and 34 on a plurality of layers. In other words, the spiral-shaped coil conductor patterns 31 and 34 are provided on different insulating layers, respectively.

An inner end portion of the coil conductor pattern 31, which is not illustrated, is connected to an inner end portion of the coil conductor pattern 34 through an interlayer connection conductor. An outer end portion of the coil conductor pattern 34 is connected to the end portion of the coil conductor pattern 32 through a connection conductor pattern and an interlayer connection conductor.

The circuit board 201 includes a conductor pattern 61 therein, and the circuit board 202 includes a conductor pattern 62 therein. The mounted component 83 is mounted on the front surface of the circuit board 202 (on the upper surface of the circuit board 202 in FIG. 9).

As illustrated in FIG. 9, the multilayer substrate 10F, in a state of being bent along the outline of the mounted component 83, is connected to each of the circuit boards 201 and 202. Specifically, the connector 81 of the multilayer substrate 10F is connected to a receptacle (not illustrated) mounted on the circuit board 202. In addition, the connector 82 is connected to a receptacle (not illustrated) mounted on the circuit board 201.

As illustrated in FIG. 9, at least a portion of the coil portion CP, when viewed in the stacking direction (the coil axis AX or the X-axis direction), is overlapped with the mounted component 83. In a portion in which the coil portion CP and the mounted component 83 are overlapped with each other, a distance L1A between the first principal surface VS1 and the mounted component 83 is larger than a distance L2A between the second principal surface VS2 and the mounted component 83 (L1A>L2A).

In the electronic device 306 according to the sixth preferred embodiment, in the portion in which the coil portion CP and the mounted component 83 are overlapped with each other, the mounted component 83 is spaced farther away from the first principal surface VS1 including the coil conductor patterns 31 and 32 than from the second principal surface VS2. Therefore, as compared to a case in which the mounted component 83 is disposed in proximity to the first principal surface VS1 of the stacked body 20D, the distance between the coil portion CP and the mounted component 83 is increased, so that an unnecessary capacitance (a stray capacitance) to be generated between the coil portion CP and the mounted component 83 is able to be significantly reduced or prevented.

In addition, even when, as in the electronic device 306, the spiral-shaped coil conductor patterns 31 and 34 are provided on a plurality of layers, the mounted component 83 is preferably spaced farther away from the first principal surface VS1 than from the second principal surface VS2. The coil conductor pattern (the coil conductor patterns 31 and 32) provided on the first principal surface VS1 has a large conductor area, as compared to the coil conductor pattern (the coil conductor pattern 34) provided on another layer. Therefore, the mounted component 83 is spaced farther away from the first principal surface VS1 having a relatively large conductor area than from the second principal surface VS2, so that an unnecessary capacitance (a stray capacitance) to be generated between the coil portion CP and the mounted component 83 is able to be reduced or prevented.

It is to be noted that, in a case in which the multilayer substrate includes a bent portion, positional shift, deformation, or other deviations of the coil conductor pattern are easily caused, and thus an unnecessary capacitance (a stray capacitance) to be generated between the coil portion CP and the mounted component 83 is easily changed. Therefore, the mounted component 83 is spaced farther from the first principal surface VS1 having a relatively large conductor area than from the second principal surface VS2, so that a change in the amount of an unnecessary capacitance (a stray capacitance) caused by the bending of the multilayer substrate is able to be reduced or prevented.

Seventh Preferred Embodiment

Figure 10:
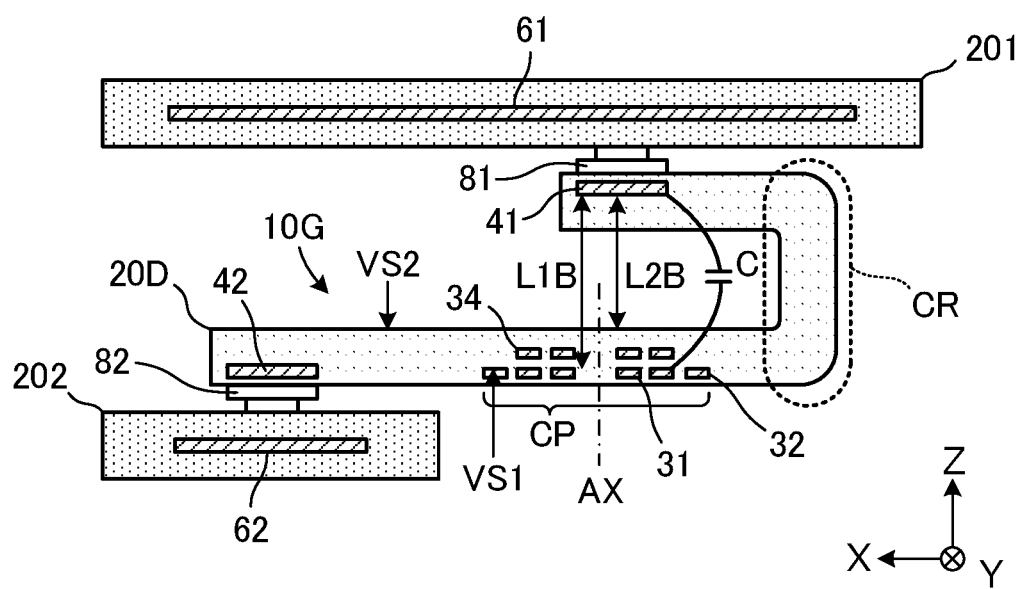
FIG. 10 is a cross-sectional view of a main portion of an electronic device 307 according to a seventh preferred embodiment of the present invention.

An electronic device according to a seventh preferred embodiment of the present invention will be described with reference to the drawings. FIG. 10 is a cross-sectional view of a main portion of an electronic device 307 according to the seventh preferred embodiment of the present invention.

The electronic device 307 includes a multilayer substrate 10G and circuit boards 201 and 202.

In the multilayer substrate 10G, as in the multilayer substrate 10D according to the fifth preferred embodiment, connectors 81 and 82 are mounted on the first principal surface VS1 of the stacked body 20D. The multilayer substrates 10G is different from the multilayer substrate 10D in that a wiring portion includes a bent portion and a coil conductor pattern 34 is provided. Other configurations of the multilayer substrate 10G are the same or substantially the same as the configurations of the multilayer substrate 10D.

The coil conductor pattern 34 preferably has a spiral shape. The multilayer substrate 10G, as in the third preferred embodiment, includes spiral-shaped coil conductor patterns 31 and 34 on a plurality of layers. In other words, the spiral-shaped coil conductor patterns 31 and 34 are provided on different insulating layers, respectively.

An inner end portion of the coil conductor pattern 31, which is not illustrated, is connected to an inner end portion of the coil conductor pattern 34 through an interlayer connection conductor. An outer end portion of the coil conductor pattern 34 is connected to the end portion of the coil conductor pattern 32 through a connection conductor pattern and an interlayer connection conductor.

The circuit board 201 includes a conductor pattern 61 therein, and the circuit board 202 includes a conductor pattern 62 therein.

The multilayer substrate 10G includes a bent portion CR in the wiring portion. As illustrated in FIG. 10, the multilayer substrate 10G, in a state of being bent in a U shape so that the second principal surface VS2 of the wiring portion faces inward, is connected to each of the circuit boards 201 and 202. Specifically, the connector 81 of the multilayer substrate 10G is connected to a receptacle (not illustrated) mounted on the circuit board 201. In addition, the connector 82 is connected to a receptacle (not illustrated) mounted on the circuit board 202.

As illustrated in FIG. 10, at least a portion of the coil portion CP, when viewed in the stacking direction (the coil axis AX or the Z-axis direction), is overlapped with the terminal conductor 41 (the first terminal conductor). In a portion in which the coil portion CP and the terminal conductor 41 are overlapped with each other, a distance L1B between the first principal surface VS1 and the terminal conductor 41 is larger than a distance L2B between the second principal surface VS2 and the terminal conductor (L1B>L2B).

In the electronic device 307 according to the seventh preferred embodiment, in the portion in which the coil portion CP and the terminal conductor 41 are overlapped with each other, the terminal conductor 41 is spaced farther away from the first principal surface VS1 including the coil conductor patterns 31 and 32 than from the second principal surface VS2. Therefore, as compared to a case in which the terminal conductor 41 is disposed in proximity to the first principal surface VS1 of the stacked body 20D, the distance between the coil portion CP and the terminal conductor 41 is increased, so that an unnecessary capacitance (a stray capacitance) to be generated between the coil portion CP and the terminal conductor 41 is able to be reduced or prevented.

In addition, even when, as in the electronic device 307, the spiral-shaped coil conductor patterns 31 and 34 are provided on a plurality of layers, the terminal conductor 41 is preferably spaced farther away from the first principal surface VS1 than from the second principal surface VS2. The coil conductor pattern (the coil conductor patterns 31 and 32) provided on the first principal surface VS1 has a large conductor area, as compared to the coil conductor pattern (the coil conductor pattern 34) provided on another layer. Therefore, the terminal conductor 41 is spaced farther away from the first principal surface VS1 having a relatively large conductor area than from the second principal surface VS2, so that an unnecessary capacitance (a stray capacitance) to be generated between the coil portion CP and the terminal conductor 41 is able to be reduced or prevented.

It is to be noted that, in a case in which the multilayer substrate includes a bent portion, positional shift, deformation, or deviations of the coil conductor pattern are easily caused, and thus an unnecessary capacitance (a stray capacitance) to be generated between the coil portion CP and the terminal conductor 41 is easily changed. Therefore, the terminal conductor 41 is spaced farther from the first principal surface VS1 having a relatively large conductor area than from the second principal surface VS2, so that a change in the amount of an unnecessary capacitance (a stray capacitance) caused by the bending of the multilayer substrate is able to be reduced or prevented.

In addition, a terminal conductor often has a comparatively large area (a width that is larger than a line width of a wiring conductor pattern is provided, for example) in order to improve connection reliability with a connector or other structure, so that an unnecessary capacitance to be generated between the terminal conductor and the coil portion CP may be increased. However, according to this configuration, the unnecessary capacitance to be generated between the coil portion CP and the terminal conductor is able to be effectively reduced or prevented.

It is to be noted that, while the seventh preferred embodiment describes an example in which at least a portion of the coil portion CP, when viewed in the stacking direction, is overlapped with the terminal conductor 41 (the first terminal conductor), the present invention is not limited to this configuration. Even when at least a portion of the coil portion CP, when viewed in the stacking direction, is overlapped with the terminal conductor 42 (the second terminal conductor), an unnecessary capacitance to be generated between the coil portion CP and the terminal conductor 42 is able to be reduced or prevented, with the above configuration. In other words, in the portion in which the coil portion CP and the terminal conductor 42 are overlapped with each other, the distance between the first principal surface VS1 and the terminal conductor 42 is larger than the distance between the second principal surface VS2 and the terminal conductor 42, so that an unnecessary capacitance to be generated between the coil portion CP and the terminal conductor 42 is able to be reduced or prevented.

While each of the above-described preferred embodiments describes an example in which the stacked body has a rectangular or substantially rectangular parallelepiped shape or a rectangular or substantially rectangular flat plate shape, the present invention is not limited to this configuration. The shape of the stacked body is able to be appropriately changed within the scope of operations and advantageous effects of the preferred embodiments of the present invention. The planar shape of the stacked body may be a circle, an ellipse, a polygon, a T shape, a Y shape, or an L shape, for example.

In addition, while each of the above-described preferred embodiments describes a configuration example in which the wiring conductor patterns 37 and 38 and the wiring portion (the transmission line) linearly extend in the longitudinal direction (the X-axis direction) of the stacked body, the present invention is not limited to this configuration. The shape, number, wiring path, and other structure of the wiring conductor pattern are also able to be appropriately changed within the scope of operations and features of the preferred embodiments of the present invention. In other words, the wiring portion may be a multicore wiring pattern, or the wiring portion (wiring conductor pattern) may be bent, for example. In addition, in a case in which the wiring portion is a multicore wiring pattern (in a case of including a plurality of wiring conductor patterns), the wiring portion may include a branching portion.

While the above-described fifth, sixth, and seventh preferred embodiments describe an example of the wiring portion LP1 including the wiring conductor pattern 37, and the wiring portion LP2 including the wiring conductor pattern 38, the configuration of the wiring portion is not limited to this specific configuration. The wiring portion may include a stripline structure, a microstrip line structure, or a coplanar line, for example.

It is to be noted that, while the above-described fifth, sixth, and seventh preferred embodiments describe an example in which a multilayer substrate is connected to a circuit board using a connector, the present invention is not limited to this configuration. The connector is not an essential component. The terminal conductor of a multilayer substrate may be directly joined to a circuit board through a conductive joining material, such as solder, for example.

In addition, while the above-described fifth, sixth, and seventh preferred embodiments describe an example of the multilayer substrate including two connectors 81 and 82, the present invention is not limited to such a configuration. The number of connectors is able to be properly changed by the circuit configuration of the multilayer substrate. In other words, the multilayer substrate may include three or more connectors, for example.

Similarly, while the first, second, third, and fourth preferred embodiments describe an example in which two rectangular terminal conductors 41 and 42 are provided on the back surface of the stacked body, the present invention is not limited to this configuration. The shape of the terminal conductor and the number of terminal conductors are able to be properly changed by the circuit configuration of the multilayer substrate. In other words, the multilayer substrate may include three or more terminal conductors, for example. In addition, the shape of the terminal conductor may be a circle, an ellipse, a polygon, a T shape, or an L shape, for example.

It is to be noted that the configurations of the above-described preferred embodiments are able to be respectively combined, and the advantageous operational effects by each of the configurations of each of the above-described preferred embodiments is able to be obtained according to these combined configurations.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a stacked body including a plurality of insulating layers that are stacked on each other;
    a first coil conductor pattern that is provided on at least a front surface of an insulating layer among the plurality of insulating layers, the insulating layer being a surface layer of the stacked body, the front surface being a front surface of the stacked body, and has a wound shape including a first end and a second end;
    a second coil conductor pattern that is provided on the front surface of the stacked body, and includes a third end and a fourth end;
    a connection conductor pattern that is provided in the stacked body, and connects the first coil conductor pattern and the second coil conductor pattern;
    a first terminal conductor that is provided in the stacked body; and
    a second terminal conductor that is provided in the stacked body; wherein
    the first end of the first coil conductor pattern is connected to the first terminal conductor;
    the fourth end of the second coil conductor pattern is connected to the second terminal conductor;
    the connection conductor pattern connects the second end of the first coil conductor pattern and the third end of the second coil conductor pattern;
    the first terminal conductor and the second terminal conductor are disposed at positions interposing the first coil conductor pattern when viewed in a stacking direction in which the plurality of insulating layers are stacked on each other;
    an entire length of the second coil conductor pattern is disposed along an outer periphery of the first coil conductor pattern on the surface layer and in parallel with only a portion of the first coil conductor pattern;
    an entire length of the second coil conductor pattern and the portion of the first coil conductor pattern that extend in parallel with each other define a parallel portion;
    an electric current direction of the first coil conductor pattern, in the parallel portion, is a same as an electric current direction of the second coil conductor pattern;

the parallel portion at the first coil conductor pattern is disposed between the first end and an intermediate position where a distance between the first end and the intermediate position along an electric current path of the first coil conductor pattern is equal to a distance between the second end and the intermediate position along the electric current path of the first coil conductor pattern in the electric current path of the first coil conductor pattern; and the parallel portion at the first coil conductor pattern is not disposed between the second end and the intermediate position in the electric current path of the first coil conductor pattern.

2. The multilayer substrate according to claim 1, further comprising a dielectric layer that covers the front surface of the stacked body.

3. The multilayer substrate according to claim 2, wherein a relative permittivity of the dielectric layer is higher than a relative permittivity of the insulating layer.

4. The multilayer substrate according to claim 1, wherein the parallel portion includes a separation distance adjusting portion to adjust a distance between the first coil conductor pattern and the second coil conductor pattern.

5. The multilayer substrate according to claim 1, wherein the first coil conductor pattern is in contact with two or more insulating layers of the plurality of insulating layers including the surface layer.

6. The multilayer substrate according to claim 1, wherein the first terminal conductor and the second terminal conductor are provided on a back surface of the stacked body.

7. The multilayer substrate according to claim 1, further comprising:
a wiring conductor pattern that connects the first end and the first terminal conductor or connects the fourth end and the second terminal conductor;
a coil portion at which the first coil conductor pattern, the second coil conductor pattern, and the connection conductor pattern are disposed when viewed in the stacking direction of the plurality of insulating layers; and
a wiring portion at which the wiring conductor pattern is provided when viewed in the stacking direction; wherein
the stacked body has flexibility and includes a first principal surface and a second principal surface that face each other; and
the first principal surface is the front surface of the stacked body on which the first coil conductor pattern and the second coil conductor pattern are provided.

8. An electronic device comprising:
the multilayer substrate according to claim 7; and
a circuit board that includes a conductor pattern; wherein
at least a portion of the coil portion is overlapped with the conductor pattern of the circuit board when viewed in the stacking direction; and
a distance between the first principal surface and the conductor pattern in the portion in which the coil portion and the conductor pattern are overlapped with each other is larger than a distance between the second principal surface and the conductor pattern in the portion in which the coil portion and the conductor pattern are overlapped with each other.

9. The electronic device according to claim 8, further comprising a dielectric layer that covers the front surface of the stacked body.

10. The electronic device according to claim 9, wherein a relative permittivity of the dielectric layer is higher than a relative permittivity of the insulating layer.

11. The electronic device according to claim 8, wherein the parallel portion includes a separation distance adjusting portion to adjust a distance between the first coil conductor pattern and the second coil conductor pattern.

12. An electronic device comprising:
the multilayer substrate according to claim 7;
a circuit board; and
a mounted component that is mounted on the circuit board; wherein
at least a portion of the coil portion is overlapped with the mounted component when viewed in the stacking direction; and
a distance between the first principal surface and the mounted component in the portion in which the coil portion and the mounted component are overlapped with each other is larger than a distance between the second principal surface and the mounted component in the portion in which the coil portion and the mounted component are overlapped with each other.

13. The electronic device according to claim 12, further comprising a dielectric layer that covers the front surface of the stacked body.

14. The electronic device according to claim 13, wherein a relative permittivity of the dielectric layer is higher than a relative permittivity of the insulating layer.

15. The electronic device according to claim 12, wherein the parallel portion includes a separation distance adjusting portion to adjust a distance between the first coil conductor pattern and the second coil conductor pattern.

16. An electronic device comprising:
the multilayer substrate according to claim 7; wherein
the multilayer substrate includes a bent portion in the wiring portion;
at least a portion of the coil portion is overlapped with the first terminal conductor when viewed in the stacking direction; and
a distance between the first principal surface and the first terminal conductor in the portion in which the coil portion and the first terminal conductor are overlapped with each other is larger than a distance between the second principal surface and the first terminal conductor in the portion in which the coil portion and the first terminal conductor are overlapped with each other.

17. The electronic device according to claim 16, wherein the coil portion includes at least a portion that is overlapped with the second terminal conductor when viewed in the stacking direction; and
a distance between the first principal surface and the second terminal conductor in the portion in which the coil portion and the second terminal conductor are overlapped with each other is larger than a distance between the second principal surface and the second terminal conductor in the portion in which the coil portion and the second terminal conductor are overlapped with each other.

18. The electronic device according to claim 16, further comprising a dielectric layer that covers the front surface of the stacked body.

19. The electronic device according to claim 18, wherein a relative permittivity of the dielectric layer is higher than a relative permittivity of the insulating layer.

20. The electronic device according to claim 16, wherein the parallel portion includes a separation distance adjusting portion to adjust a distance between the first coil conductor pattern and the second coil conductor pattern.

* * * * *